United States Patent [19]
Tateyama

[11] Patent Number: 6,008,978
[45] Date of Patent: Dec. 28, 1999

[54] DISCHARGING METHOD AND PROCESSING APPARATUS HAVING DISCHARGING FUNCTION

[75] Inventor: Kiyohisa Tateyama, Kumamoto, Japan

[73] Assignee: Tokyo Electron Limited, Tokyo, Japan

[21] Appl. No.: 09/066,602

[22] Filed: Apr. 27, 1998

[30] Foreign Application Priority Data

May 7, 1997 [JP] Japan ................................ 9-131615

[51] Int. Cl.⁶ .................................................. H05F 13/00
[52] U.S. Cl. ........................................ 361/212; 361/220
[58] Field of Search ............................. 361/212, 213, 361/220

[56] References Cited

U.S. PATENT DOCUMENTS 5,382,311   1/1995   Ishikawa et al. ................... 156/345
5,910,878   6/1999   Mello et al. ........................ 361/212

*Primary Examiner*—Fritz Fleming
*Attorney, Agent, or Firm*—Foley & Lardner

[57] ABSTRACT

A method and system for eliminating electrostatic charge of a processing section in which a processed object is transferred along a predetermined path for receiving treatment. An electrostatic charge eliminating member, arranged independently of the processing section, is transferred along the path of the processed object to eliminate the electrostatic charge of the processing section.

7 Claims, 4 Drawing Sheets

DISCHARGING METHOD AND PROCESSING APPARATUS HAVING DISCHARGING FUNCTION

BACKGROUND OF THE INVENTION

The present invention relates to a method of discharging a processing apparatus for providing a predetermined process to an object to be processed, for example, a liquid crystal display (LCD) substrate or a semiconductor wafer, and to a processing apparatus having a discharging function.

In the manufacture of, for example, an LCD and a semiconductor device, a circuit is formed by the so-called lithography in which a substrate as a processing object is coated with photoresist, photoresist is exposed in accordance with a circuit pattern, and the resultant is developed.

Such a resist coating and developing process is performed by a resist coating and developing system having a cleaning unit for cleaning the substrate, an adhesion unit for providing an adhesion process to the substrate, a coating unit for resist coating on the substrate, a heating unit for heating the substrate, a cooling unit for cooling the heated substrate to ordinary temperatures, and a developing unit for providing a developing process to the exposed substrate.

In such a resist coating and developing system, a substrate mounting base and a vacuum chuck, etc., are present in each unit. The substrate is transferred to each unit by a transfer arm. However, the substrate mounting base, the vacuum chuck, and the transfer arm are easily charged, and static electricity is easily generated. Then, particles are easily absorbed on the portion where static electricity is generated. The generated particles have an adverse influence on the substrate. Moreover, this may cause breakage of static electricity. To solve these problems, an ionizer is conventionally used to discharge the portion where static electricity is generated.

However, the ionizer is a large-sized and expensive apparatus, and its maintenance is required. Also, since an attaching location of the ionizer is limited, there occurs a portion that cannot be discharged. Moreover, the ionizer itself may generate particles.

BRIEF SUMMARY OF THE INVENTION

An object of the present invention is to provide a discharging method of discharging easily and surely a processing apparatus without using an ionizer, and to a processing apparatus having a discharging function capable of performing such discharge.

According to a first aspect of the present invention, there is provided a method of discharging a processing apparatus for providing a predetermined process to an object to be processed, comprising the step of making a member having an electrostatic neutralizing function to flow into the apparatus at a flow of at least a part of a process flow of the object to be processed.

According to a second aspect of the present invention, there is provided a processing apparatus, having a discharging function, comprising:

processing mechanisms for providing processes to an object to be processed;

an object holding section for holding the object to be processed;

a standby section for placing a member having an electrostatic neutralizing function in a standby condition;

transfer mechanisms for selectively transferring the object to be processed and the member having the electrostatic neutralizing function to/from the processing mechanism; and controller for controlling the transfer mechanisms so as to make the member having the electrostatic neutralizing function to flow into the apparatus at a flow of at least a part of a process flow of the object to be processed after completion of processing a predetermined number of objects, whereby the apparatus is discharged by the member having the electrostatic neutralizing function.

According to a third aspect of the present invention, there is provided processing apparatus, having a discharging function, comprising:

a processing section having a plurality of processing mechanisms for applying processes to an object to be processed;

an object holding section for holding the object to be processed;

a standby section, provided in the object holding section, for placing a member having an electrostatic neutralizing function in a standby condition;

a first transfer mechanism for selectively transferring the object to be processed and the member having the electrostatic neutralizing function to/from the processing mechanism;

a second transfer mechanism for transferring the object to be processed and the member having the electrostatic neutralizing function to/from each processing mechanism in the processing section; and controller for controlling the first and second transfer mechanisms so as to make the member having the electrostatic neutralizing function to flow into the apparatus at a flow of at least a part of a process flow of the object to be processed after completion of processing a predetermined number of objects, whereby the apparatus is discharged by the member having the electrostatic neutralizing function.

According to the first aspect, the member having the function of neutralizing static electricity is made to flow into the apparatus at the flow of at least the part of the flow of the object to be processed, thereby discharging the processing apparatus. Therefore, the portion of the apparatus where static electricity is generated by the object to be processed can be surely discharged without using the large-sized apparatus such as the ionizer.

According to the second and third aspects, after completion of processing the predetermined number of the objects, controlling means controls the transfer mechanisms such that the member having the function of neutralizing static electricity is made to flow into the apparatus from the standby section at the flow of at least the part of the flow of the object to be processed, thereby discharging the processing apparatus. Therefore, the portion of the apparatus where static electricity is generated by the object to be processed can be surely and automatically discharged without using the large-sized apparatus such as the ionizer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
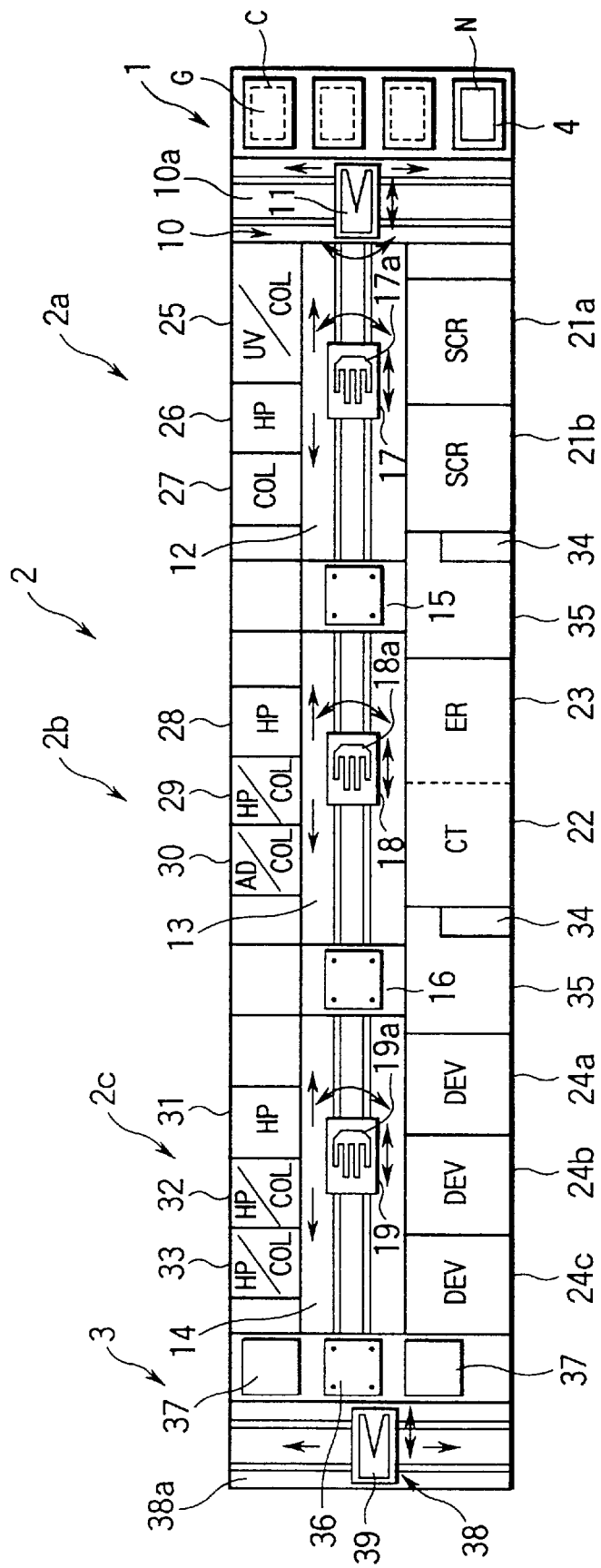
FIG. 1 is a plane view showing a resist coating and developing system to which the present invention is applied.

FIG. 1 is a plane view showing a coating and developing system of an LCD substrate to which the present invention is applied.

The coating and developing system comprises a cassette station 1, a processing section 2, and an interface section 3. The cassette station 1 mounts cassettes C containing plurality of substrates G. The processing section 2 has a plurality of processing units for providing a series of processes, including resist coating and developing, to the substrate G. The interface 3 performs delivery of the substrate G between an exposing apparatus (not shown) and the interface. The cassette station 1 and the interface 3 are arranged at both ends of the processing section 2, respectively.

The cassette station 1 has a transfer mechanism 10 for transferring the LCD substrate between the cassette C and the processing section 2. At the cassette station 1, the cassette C is carried in or out. The transfer mechanism 10 has an arm 11 movable over a transfer passage 10a formed along a cassette array direction. The substrate G is transferred between the cassettes C and the processing section 2 by the transfer arm 11.

Figure 2:
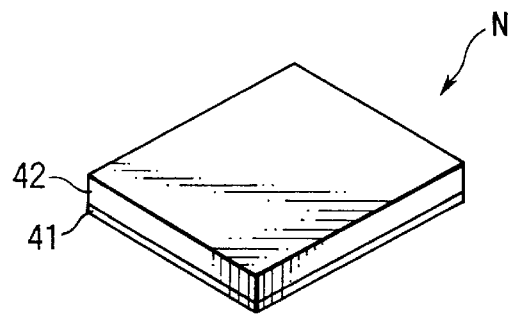
FIG. 2 is a perspective view showing one example of a member having an electrostatic neutralizing function used in the present invention.

The cassette station 1 also has a standby section 4 arranged in parallel to the cassette C. The standby section 4 places a member N for neutralizing static electricity in a standby condition. As shown in FIG. 2, the member N having an electrostatic neutralizing function is formed such that a sheet 41, made of a material having a function of neutralizing static electricity, and a core material 42 are layered on each other. The size and shape of the member surface are substantially the same as those of a substrate G. As sheet 41, there can be used synthetic rubber having an electrostatic neutralizing function (trade name: soldion), and a material, which can be obtained in such a way that a surface of a plate-like core material is coated with wetting material and alcohol is absorbed.

Then, as explained later, the transfer arm 11 selectively transfers the substrate G and the member N having the electrostatic neutralizing function.

The processing section 2 is divided into a front stage section 2a, a middle stage section 2b, and a back stage section 2c. These stages 2a to 2c have transfer passages 12, 13, and 14 at their center, respectively. The respective process units are provided at both sides of each of the transfer passages. Then, relay sections 15 and 16 are formed therebetween.

The front stage section 2a has a main transfer apparatus 17 movable along the transfer passage 12. Two cleaning units (SCR) 21a and 21b are arranged at one side of the transfer passage 12. An ultraviolet radiation and cooling unit (UV/COL) 25, a heating process unit (HP) 26, which has upper and lower stages, and a cooling unit (COL) 27, which has upper and lower stages, are arranged at the other side of the transfer passage 12.

The middle stage section 2b has a main transfer apparatus 18 movable along the transfer passage 13. A resist coating process unit (CT) 22 and an edge resist removing unit (ER) 23 for removing resist on the edge of the substrate G are arranged as one unit at one side of the transfer passage 13. A heating process unit (HP) 28, a heating process and cooling unit (HP/COL) 29, and an adhesion process and cooling unit (AD/COL) 30 are arranged at the other side of the transfer passage 13. The heating process unit (HP) 28 is stacked two stages. The heating process and cooling unit (HP/COL) 29 is formed by layering a heating process unit and a cooling process unit up and down. The adhesion process and cooling unit (AD/COL) 30 is formed by layering an adhesion process unit and a cooling unit up and down.

The back stage section 2c has a main transfer apparatus 19, which is movable along the transfer passage 14. Three developing process units 24a, 24b, 24c are arranged at one side of the passage 14. A heating process unit 31, and two heating process and cooling units (HP/COL) 32 and 33 are arranged at the other side of the passage 14.

The heating process unit 31 is made up of upper and lower stages. Each of the heating process and cooling unit (HP/COL) 32 and 33 is formed by layering a heating process unit and a cooling process unit up and down.

In the processing section 2, only spinner system units such as a cleaning process unit 21a, a resist process unit 22, and a developing process unit 24a are arranged at one side to sandwich the passage therebetween. Also, only thermal system process units such as a heat process unit and a cool process unit are arranged at the other side.

Moreover, chemical supply units 34 are arranged at the spinner system unit arranging side of the relays 15 and 16, and spaces 35 where the main transfer apparatus can move in or out are formed.

Each of the main transfer apparatus 17, 18, and 19 has two-way X-, Y-axial drive mechanisms on a horizontal plane, and a Z-axial drive mechanism in a vertical direction. Moreover, the main transfer apparatus 17, 18, and 19 have a rotation drive mechanism rotating around the Z-axis, and arms 17a, 18a, and 19a for supporting the substrate G, respectively.

The main transfer apparatus 17 has the following function. Specifically, the substrate G is delivered between the arm 11 of the transfer mechanism 10 and the transfer apparatus, the substrate G is carried to/from each process unit of the front stage section 2a, and the substrate G is delivered between the relay section 15 and the transfer apparatus.

Also, the main transfer apparatus 18 has the following function.

Specifically, the substrate G is delivered between the relay section 15 and the transfer apparatus, the substrate G is carried to/from each process unit of the front stage section 2b, and the substrate G is delivered between the relay section 16 and the transfer apparatus.

Moreover, the main transfer apparatus 19 has the following function.

Specifically, the substrate G is delivered between the relay section 16 and the transfer apparatus, the substrate G is carried to/from each process unit of the front stage section 2c, and the substrate G is delivered between the interface section 3 and the transfer apparatus.

It is noted that the relay sections 15 and 16 also function as cooling plates.

The interface section 3 comprises an extension 36, two buffer stages 37, and a transfer mechanism 38.

The extension 36 holds the substrate temporarily on delivery of the substrate between the processing section 2 and the interface 3. The buffer stages 37 are provided at both sides of the extension 36 to place buffer cassettes. The transfer mechanism 38 carries in/out between the substrate G between the buffer stages and an exposing apparatus (not shown). The transfer mechanism 38 has a transfer arm 39 movable over a transfer passage 38a formed along the direction where the extension 36 and the buffer stages 7 are arranged. The transfer of the substrate G is carried out between the processing section 2 and the exposing apparatus by the transfer arm 39.

Figure 3:
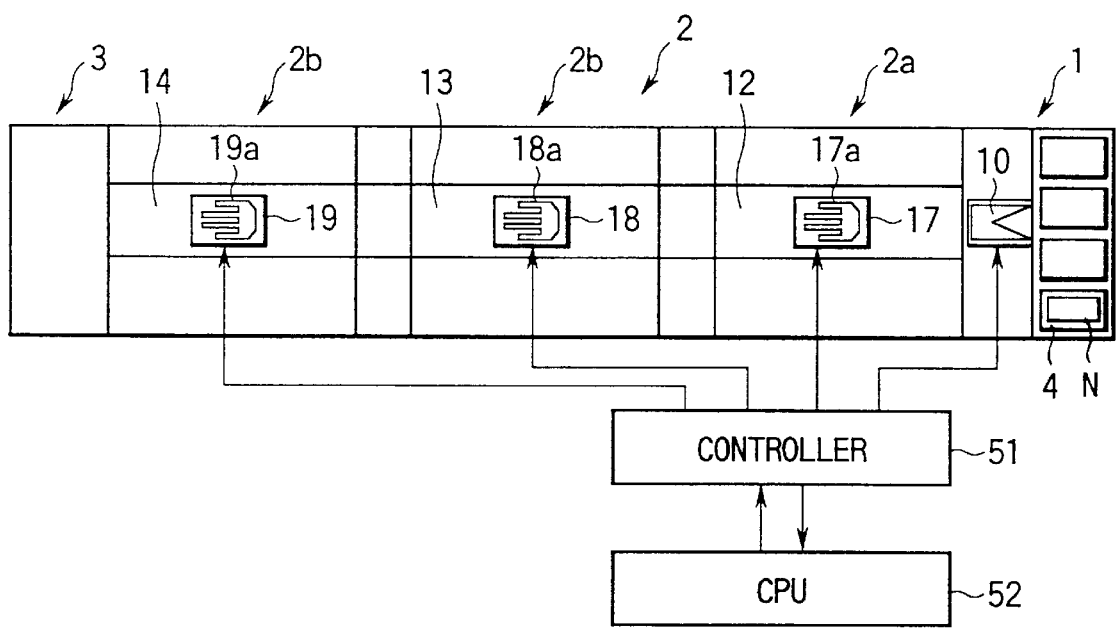
FIG. 3 is a schematic view showing a transfer mechanism, which is applied to the coating and developing system of FIG. 1, and a control system of main transfer apparatus.

A drive system, including the transfer mechanism 10 of the cassette station 1 and the main transfer apparatus 17, 18, 19, is connected to a controller 51 to be controlled by a control signal from the controller 51 as shown in FIG. 3. A CPU 52 for controlling entire system controls the controller 51. The controller 51 controls the drive system including the transfer arm 11 and main arms 18 and 19 as follows.

Specifically, after completion of the coating and developing process of a predetermined number of substrates, for example, one lot of substrates G, the controller 51 takes up the member N having the electrostatic neutralizing function from the standby section 13. Then, the controller 51 controls the drive system such that the member N is transferred into the apparatus along the same transfer path as that of the substrate G or along a part of the transfer path of the substrate G.

In the above-structured coating and developing system, the substrate G of the cassette C is transferred to the processing section 2. In the processing section 2, first of all, the surface improvement and cleaning process is provided to the substrate G by the ultraviolet radiation and cooling unit (U/COL) 25 of the front stage section 2a, and then the substrate G is cooled. Thereafter, a scriber cleaning is provided to the substrate G by the cleaning units (SCR) 21a and 21b, and the substrate G is heated and dried by one heating process unit (HP) 26, and cooled by one cooling unit (COL) 27.

Thereafter, the substrate G is transferred to the middle stage section 2b. Then, in order to improve the fixing of resist, a hydrophobic process (HMDS process) is provided to the substrates G by the adhesion process unit (AD) of the upper stage of the unit 30. Then, the substrate G is cooled by the cooling unit (COL). Thereafter, resist coating is provided to the substrate by the resist coating unit (CT) 22, and extra resist on the edge of the substrate G is removed by the edge resist removing unit (ER) 23. Thereafter, the substrate G is pre-baked by one heating process unit (HP) of the middle stage section 2b, and cooled by the cooling unit (COL) of the lower stage of the unit 29 or 30.

Thereafter, the substrate G is transferred to the exposing apparatus from the relay section 16 through the interface section 3 by the main transfer apparatus 19. At this time, a predetermined pattern is exposed by the exposing apparatus.

Then, the substrate G is transferred again through the interface section 3, and developed by one of any developing process unit (DEV) 24a, 24b, 24c, thereby forming a predetermined circuit pattern. The developed substrate G is post-baked by one of any hating process unit (HP) of the back stage section 2c. Thereafter, the post-baked substrate G is cooled by the cooling unit (COL), and held in a predetermined cassette of the cassette station 1 by the main transfer apparatus 19, 18, 17, and the transfer mechanism 10.

After completion of such a process of a predetermined number of substrates, for example, one lot of substrates G, the controller 51 controls the drive system including the transfer mechanism 10 and the main transfer apparatus 17, 18, 19 as follows.

Specifically, the controller 51 takes up the member N having the electrostatic neutralizing function from the standby section 4. Then, the controller 51 controls the drive system such that the member N is made to flow into the apparatus at the same flow as the substrate G or the flow of the part of the substrate G.

Thus, the member N is made to flow into the apparatus at the same flow as the substrate G or the flow of the part of the substrate G. As a result, even if each unit of the mount base, the vacuum chuck, the arm 11, and the arms 17a, 18a, 19a are charged, static electricity generated thereon is neutralized by the member N so as to be substantially cancelled.

As explained above, the member N is made to flow into the apparatus at the same flow as the substrate G or the flow of the part of the substrate G, thereby discharging the processing apparatus. Therefore, the portion where static electricity is generated by the substrate G can be surely and automatically discharged without using the large-sized apparatus such as an ionizer. Also, the size and shape of the member N having the electrostatic neutralizing function are substantially the same as those of the substrate G. As a result, the member N can be easily made to flow into the apparatus at the same flow as the substrate G. In this time, static electricity generated by the substrate G can be surely discharged.

Figure 4:
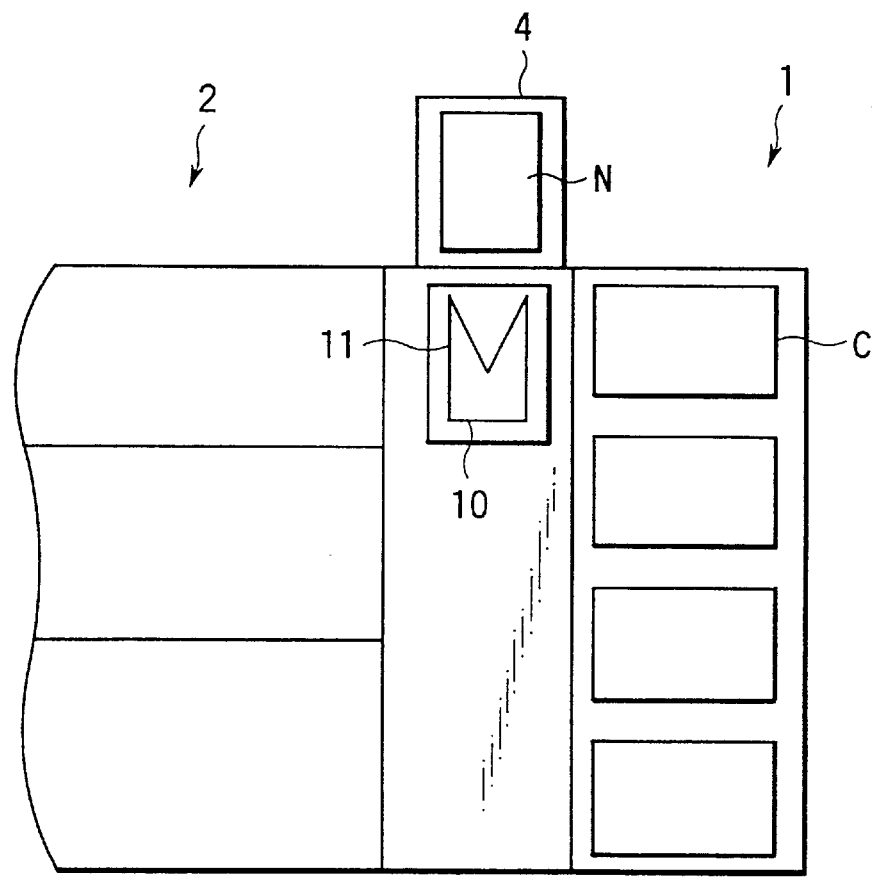
FIG. 4 is a plane view showing another example of a standby section of the member having the electrostatic neutralizing function.
Figure 5:
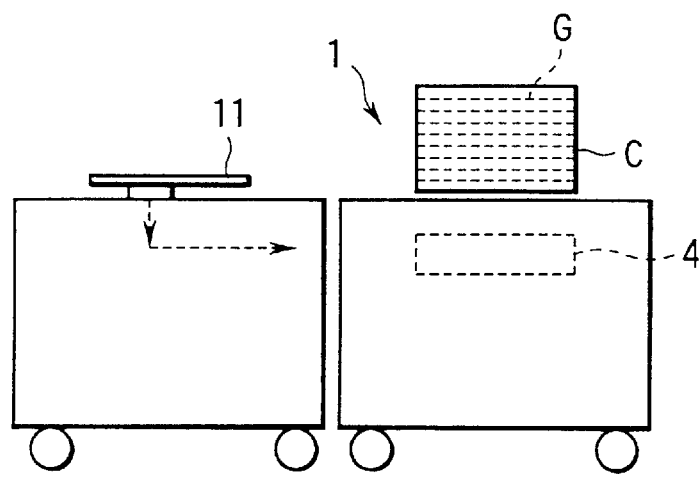
FIG. 5 is a side view showing further another example of the standby section of the member having the electrostatic neutralizing function.

The present invention is not limited to the above embodiment, and various modifications may be made. For example, in the above embodiment, the standby section 4 of the member N having the electrostatic neutralizing function was positioned to be adjacent to the cassette C. However, as shown in FIG. 4, the standby section 4 may be positioned at the side portion of the cassette station 1. Or, as shown in FIG. 5, the standby section 4 may be placed to be built in the lower portion of the cassette C of the cassette station 1. By setting the standby section 4 to such positions, there is no possibility that mount ports for the cassette C will be reduced. Also, the standby section of the member N may be simply placed above the upper portion of the cassette C. Further, the position of the standby section of the member N is not limited to the cassette station. The standby section may be placed at any position of the processing section. For example, the standby section may be placed above any heating process unit (HP), or the upper or lower portion of the relay section 15 or 16. In other words, the standby section may be placed at any position where the standby section can be transferred by the main transfer mechanisms 17, 18, 19 and the transfer mechanism 10. In this case, the formation of the standby section in the cassette station 1 can lead to the point in which the member N can be easily transferred at the same process flow as the substrate G.

Figure 6:
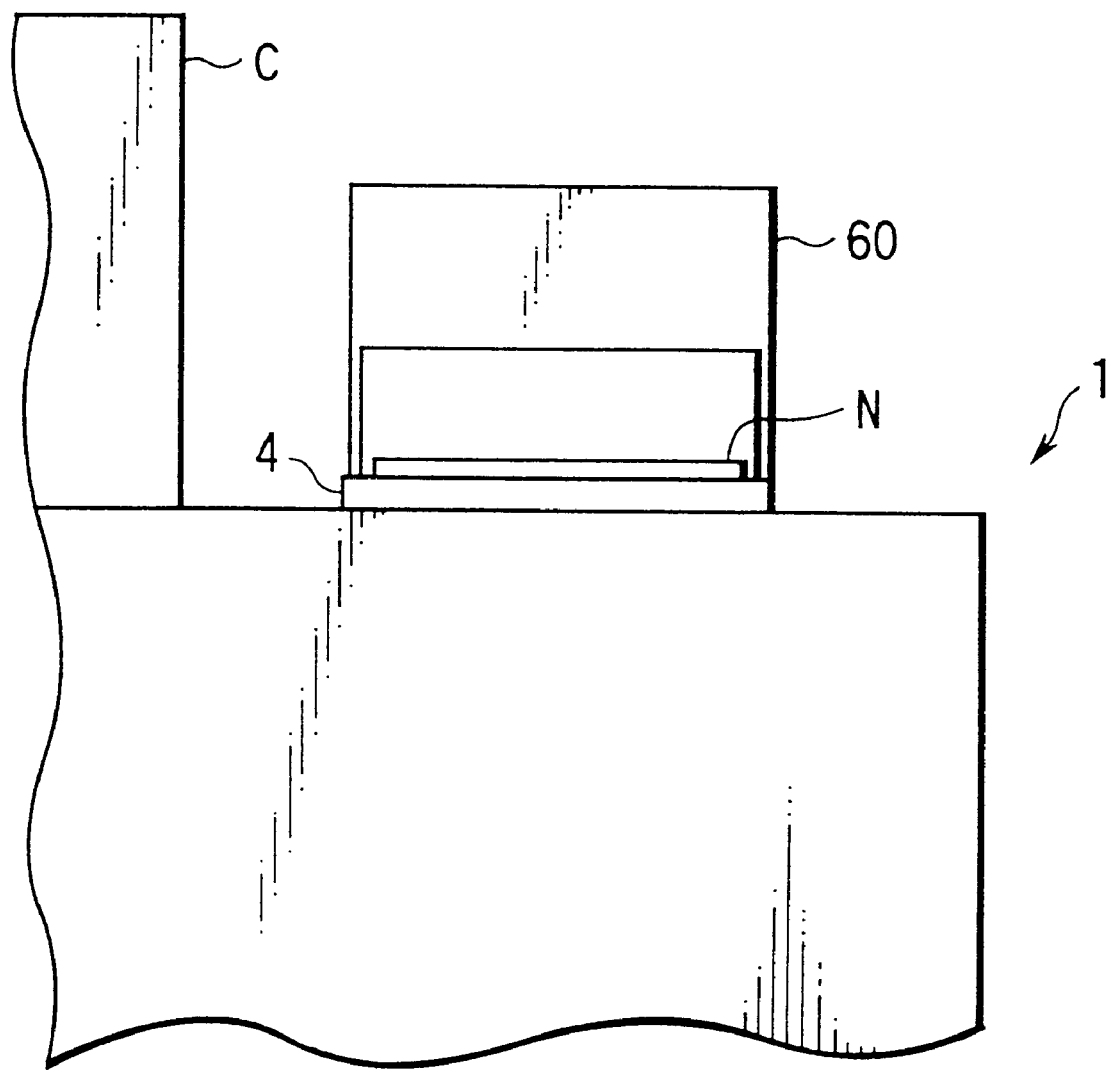
FIG. 6 is a side view showing a state in which a discharging apparatus is provided in the standby section of the member having the electrostatic neutralizing function.

As shown in FIG. 6, in the standby section, there may be provided a discharging apparatus 60 such as an ionizer discharging apparatus for discharging the member N having the electrostatic neutralizing function. Thereby, even if an electrostatic neutralizing ability is finite, the member N is discharged by the discharging apparatus 60, so that the member N can be repeatedly used. In this case, since the discharging apparatus 60 has only to discharge the member N, no large-sized apparatus is required.

The above embodiment explained the case in which the present invention was applied to the resist coating and developing system. However, the present invention may be applied to the other processing. Moreover, the above embodiment explained the case in which the LCD substrate was used as an object to be processed. However, it is needless to say that the present invention can be applied to the case of processing the other objects such as a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for eliminating an electrostatic charge of a processing section in which an object to be processed is transferred along a predetermined path for receiving a predetermined treatment, the method comprising the steps of:

providing an electrostatic charge eliminating member arranged independently of the processing section, said electrostatic charge eliminating member performing an electrostatic charge neutralizing function; and transferring said electrostatic charge eliminating member along the path of the object, thereby eliminating the electrostatic charge of the processing section.

2. The method according to claim 1, wherein said electrostatic charge eliminating member is substantially equal to said object in size and shape.

3. A processing system comprising:

a processing section in which an object is transferred for receiving a predetermined treatment;

a housing section for housing the object;

a standby section in which an electrostatic charge eliminating member is positioned and performs an electrostatic charge neutralizing function;

a supply mechanism for selectively transferring the object and said electrostatic charge eliminating member along the predetermined path in said processing section; and a control device that controls said supply mechanism to permit said electrostatic charge eliminating member to be supplied into the processing section after completion of the treatment applied to the object so as to eliminate the electrostatic charge within the processing section.

4. The processing system according to claim 3, wherein said electrostatic charge eliminating member is substantially equal to said object in size and shape.

5. The processing system according to claim 3, further comprising an electrostatic charge eliminating mechanism for eliminating the electrostatic charge of the electrostatic charge eliminating member within said standby section.

6. The processing system according to claim 3, wherein said standby section is positioned within said housing section.

7. The processing system according to claim 3, wherein said processing section includes a plurality of stage sections for processing said object and a transfer mechanism for selectively supplying said object or the electrostatic charge eliminating member into each stage section.

* * * * *